(12) United States Patent
Gustafsson et al.

(10) Patent No.: US 6,965,072 B2
(45) Date of Patent: Nov. 15, 2005

(54) SHIELDING ARRANGEMENT

(75) Inventors: Karl-Erik Gustafsson, Turku (FI); Jarmo Heinonen, Pertteli (FI); Jyrki Koljonen, Salo (FI); Jussi Salminen, Salo (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/361,804

(22) Filed: Feb. 7, 2003

(65) Prior Publication Data

US 2004/0154815 A1 Aug. 12, 2004

(51) Int. Cl.$^7$ ............................................. H05K 9/00
(52) U.S. Cl. .............................. 174/35 GC; 174/35 R; 361/816
(58) Field of Search .................... 174/35 R, 35 MS, 174/35 GC; 361/816, 818

(56) References Cited

U.S. PATENT DOCUMENTS

| | | | |
|---|---|---|---|
| 4,218,578 A | 8/1980 | Olschewski et al. ...... 174/35 R | |
| 4,362,899 A | 12/1982 | Borrill | |
| 4,755,630 A | 7/1988 | Smith et al. .................. 174/35 | |
| 5,119,047 A | 6/1992 | Brown et al. ................. 333/12 | |
| 5,122,065 A | 6/1992 | Dudek et al. ................. 439/76 | |
| 5,417,578 A | 5/1995 | Mroczkowski et al. ..... 439/101 | |
| 6,011,691 A | 1/2000 | Schreffler | |
| 6,329,604 B1 | 12/2001 | Koya | |
| 6,462,436 B1 | 10/2002 | Kay et al. ..................... 307/91 | |

FOREIGN PATENT DOCUMENTS

DE 10224221 12/2003
GB 2237147 A * 4/1991

OTHER PUBLICATIONS

Patent Abstracts of Japan, vol. 200, No. 002, Publication No. 11-330703, Publication Date: Nov. 30, 1999.

* cited by examiner

Primary Examiner—Hung V. Ngo

(57) ABSTRACT

The invention relates to an enhanced shielding arrangement. A shielding arrangement comprises a shielding can and a layered printed circuit board having electrical components and at least two ground potential layers. There are grounding connections between edges of the shielding can and at least one of the ground potential layers, and grounding connections between components inside the shielding can and at least one of the ground potential layers, so that the two grounding connections are connected to each other only through at least one of the ground potential layers for providing small loops.

6 Claims, 2 Drawing Sheets

SHIELDING ARRANGEMENT

TECHNICAL FIELD

The invention relates to an enhanced shielding arrangement.

BACKGROUND OF THE INVENTION

Sensitive electronic components and integrated circuits are susceptible to electromagnetic interference, EMI. The presence of electromagnetic signals therefore often interferes with the operation and performance of sensitive electronic components. When there exists electromagnetic interference, there also exists a source of EMI, a receptive component as a victim of EMI and a coupling path through which a source emission conducts to a receptive component. Certain electronic components emit electromagnetic signals during their operation. Such electromagnetically emitting components may affect the performance and operability of other components for example on the same circuit board. The EMI also degrades the reliability of components and circuits. Certain components can act both as EMI sources and as receptive components. Between a source and a receptive component there exists a so-called coupling path.

An EMI source emission can be a conducted voltage or current coupling via conducted paths through which current can flow, or an electric or magnetic field coupling through space or materials through electromagnetic wave propagation. So, the transmission of EMI can occur across a circuit or through the air due to electric field and/or magnetic field propagations. Also the electromagnetic waves can propagate through circuit boards or substrate materials. EMI signals may occur due to some electromagnetic radiator, electric- or magnetic fields or failures during the design, such as sharing of conductors with EMI sources.

For protecting the sensitive electronic components and to minimize the presence of interfering signals, an EMI shielding is employed. An EMI shielding is used for protecting electronic components from both interfering sources on the same assembly and components apart from the arrangement. Shielding cans may be applied to prevent interfering signals from being emitted by an emitting source, or to inhibit interfering signals from propagating to a receptive component. An EMI shielding can prevent electromagnetic waves, which propagate through space, by absorbing or reflecting waves incident on walls of a shielding can. Material of a shielding can is advantageously selected to be reflective and/or absorbtive so that most of interfering EMI signals or waves are reflected from and/or absorbed by the shielding walls. Shielding walls, then advantageously absorb a transmitted part of interfering waves, so a part is not reflected off. Only some residual noise or energy is then able to pass through shielding walls. This residual noise or energy forms the resulting EMI. So the essential characteristics are the reflectance and absorbance properties of a shielding can. These characteristics depend on shielding material and an interface of a shielding with a base substrate and circuit ground.

The interfaces inside the shielding and the grounding are essential parts of the shielding concept. Typically there has to be some openings in the shielding walls to form an input and output for certain wanted signals of the system. So the shielding arrangement is never perfect (closed), but it must include openings as input and output paths for signals. The problem is, that also the unwanted signals tend to use these paths, since signal lines of printed circuit boards typically act like antennas. Through these signal lines external noise gets inside the shielded environment and the signals of the system are affected and may drop out.

Another problem in shielding sensitive electrical components is grounding. Grounding and generally a grounding concept is one issue, which typically reduces shielding efficiency and disturbs the system. It is typical that printed circuit boards are stacked in order to make the arrangement as compact as possible. Usually printed circuit boards are contacted both mechanically and electrically to a base or a frame supporting the arrangement. Electrical circuits of the printed circuit board and a frame typically have one common ground potential. There are a few attempts in the prior art to avoid EMI effects by using separate ground potentials. If these different grounds of electrical circuits and the frame get into contact with each other, there may occur a ground loop between printed circuit boards. The ground loop affects the operation of the printed circuit boards by exposing those to annoying noise, which in turn distorts the circuit ground to a value over zero. This affects the proper operation of circuits.

In the patent publication U.S. Pat. No. 6,011,691 there are pronounced separate ground potentials of the printed circuit boards and the chassis. The ground potentials are separated so that a cover is added to the top and bottom of the electronic component assembly to provide a Faraday shield. Further the cover contacts a plated area around the periphery of the electronic component assembly and ensures an outer chassis ground potential and an inner ground potential of the heat sink and printed circuit boards do not come into contact. This solution is based on an inner core and a dielectric material covering at least part of the core, on which the printed circuit boards and chassis are arranged to be assembled.

SUMMARY OF THE INVENTION

The aim of the present invention is to improve the effectiveness of a shielding arrangement.

The aim is achieved by simple and enhanced grounding concept.

When a shielding can is used, the final objective is to achieve a Faraday cage, e.g. absence of electric fields, around the circuits and components to be protected or shielded. To form a Faraday cage the shielding structure is required to be solid and integral, or at least almost closed. Advantageously there are no openings bigger than wavelength/20 for the protection to be good enough for the sensitive components to operate as expected. According to an advantageous embodiment this is to be taken into account in a designing stage of printed circuit boards. The Faraday cage could be well-formed and implemented by coping with the limitation of not to over limit the predetermined size of openings and by applying a solid ground layer underneath a shielding arrangement. The shielding can is an important part of the Faraday cage, but only a part of it. The other part of the Faraday cage, forming the counterpart of the shielding can is a printed circuit board. According to an advantageous embodiment a shielding can ground is isolated from a circuit ground on upper signal layers of a multilayered printed circuit board. In the case of separating grounds of the shield and circuits, the ground layer of the shielding can provides a part of a Faraday cage, which protects the electrical circuits on the printed circuit boards from electromagnetic interference. An advantageous grounding concept also provides small loops, which in turn enhances the operability and security of the shielding arrangement.

According to an advantageous embodiment of the present invention signals of sensitive sources as well as signals of emitting sources are placed in a safe shielding. The components have an isolated area encircling them and signals propagate through shielded paths to the shielded area. Advantageously there is formed a coaxial tunnel for shielding the signals emerging within coverage of the shielding can. The coaxial tunnel is advantageously formed between ground potential layers. The coaxial tunnel is maintained from an emitting source to a corresponding receptive component. An advantageous configuration of the present invention provides a shielding arrangement without uncertain return current paths of any unwanted signals.

BRIEF DESCRIPTION OF THE DRAWINGS

In the following the invention is described in detail along with the accompanying figures, in which.

DETAILED DESCRIPTION OF THE INVENTION

Figure 1:
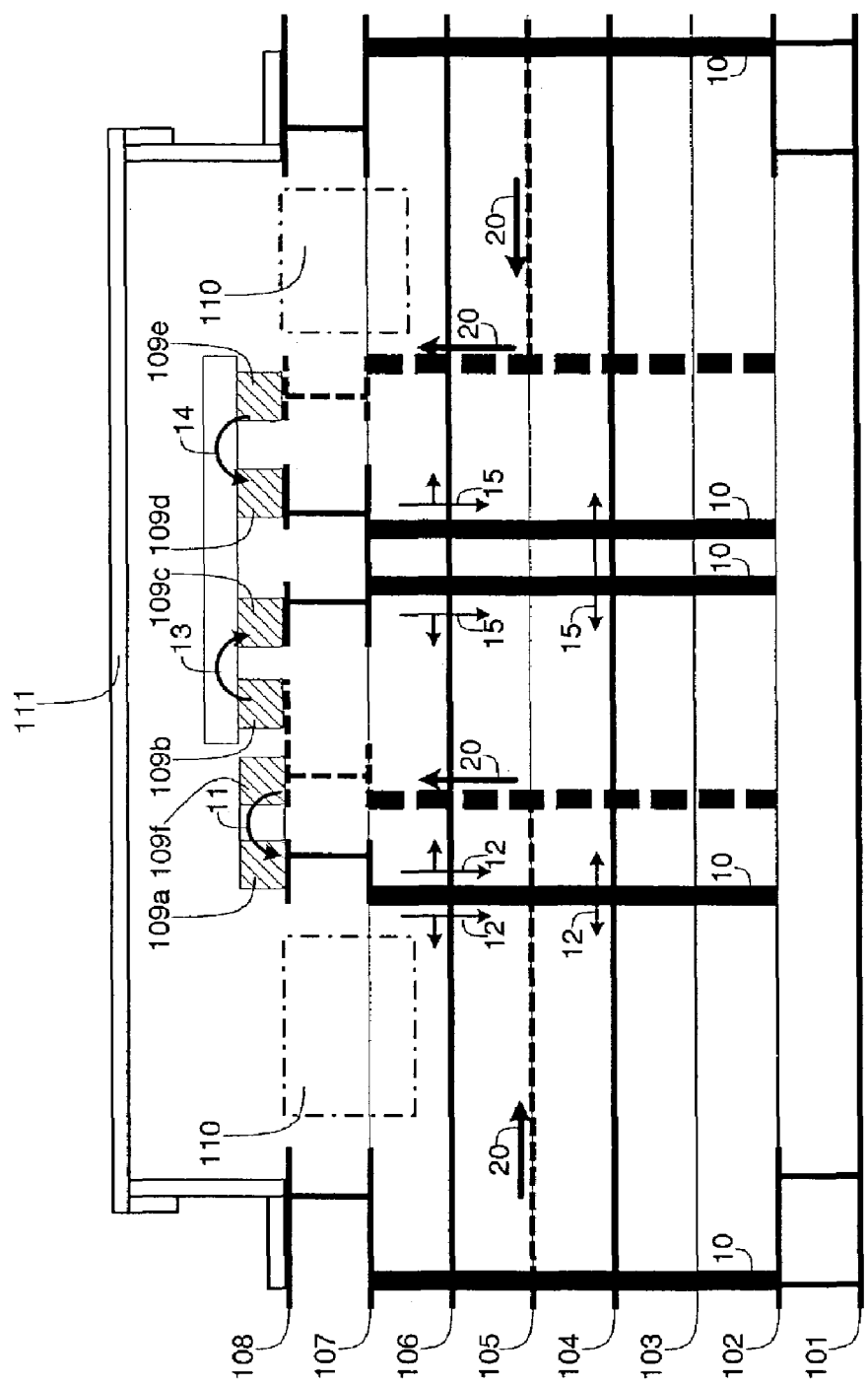
FIG. 1 illustrates a side view of an advantageous embodiment of the present invention.

FIG. 1 illustrates the basic idea of the invention according to one advantageous embodiment of the invention. FIG. 1 illustrates as a side view a multilayered printed circuit board having 8 different layers including first layer 101, which is preferably connected to ground potential to create shielding in a direction opposite from the components. Second layer 102 and third layer 103 are also signal layers unused in this exemplary embodiment. Fourth layer 104 and sixth layer 106 are signal layers in ground potential, or so-called ground layers. Fifth layer 105, seventh layer 107 and eighth layer 108 are signal layers. On the eighth signal layer 108 there are electrical components 109*a*, 109*b*, 109*c*, 109*d* 109*e* and 109*f*.

Arrows 20 illustrate the paths of signals emerging to the signal layer 108. According to an embodiment illustrated in FIG. 1 the fifth layer 105 is the one between the ground potential layers 104 and 106, on which only exterior sensitive or otherwise critical signals emerging to the signal layer 108, especially heading to components 109*a*, 109*b*, 109*e*, can go through. Dashed lines in FIG. 1 present paths of signals. On the printed circuit board there are connections and interconnections between components. The arrow 11 on the components 109*a* and 109*f* describes the direction of the current. According to an advantageous embodiment the component 109*a* is grounded straight to the ground layer 104 as illustrated by arrow 12. The grounding is performed by means of a "via" straight down to a ground layer 104, keeping the path as short as possible. The short paths are safer and not so easily impacted by interferences as long ones. With the short paths the arrangement can be better managed and controlled. The component 109*b* is connected to the component 109*c*, and the direction of the current is illustrated by an arrow 13. The component 109*e* is connected to the component 109*d* and an arrow 14 here illustrates the direction of the current. The components 109*c* and 109*d* are grounded advantageously straight to ground layers 106 and/or 104 as illustrated by arrows 15. In FIG. 1 number 10 refers grounding "vias" perpendicular to layers of the printed circuit board.

A shielding can 111 comprises a frame and a lid. A shielding can 111 is configured on the uppermost layer, above the components 109*a*, 109*b*, 109*c*, 109*d*, 109*e*, 109*f* to secure and protect components, printed circuit board and interconnections from interfering effects. The shielding can 111 is grounded along edge "via"s of the arrangement shown in FIG. 1. So also the shielding can 111 is grounded straight to ground potential layer through the shortest possible path. According to prior solutions the components have been grounded through these same edge "vias" as the shielding can. The grounding paths of components according to prior solutions proceeds on the surface of the uppermost printed circuit board to a certain grounding "via", which typically has been the same for a shielding can and components.

According to an advantageous embodiment the shielding can ground is isolated from signal ground in the upper signal layers. This is advantageous, because this way there are no large ground areas in signal layers 107 or 108, but the grounding is implemented straight downwards to a ground potential layer. This kind of grounding concept provides small loops and minimizes the probability of interferences. If any interference or noise gets to layer 108, it may cause leaking problems. So it is important to shield the layer 108, and especially the electrical area of it containing electrical components, signals and interconnections. Mainly there are components and inter-connections to be shielded in the electrical area.

By an advantageous grounding concept there are formed isolated areas 110 between shielding can 111 frame and the electrical area including electrical components in layers 107 and 108. In the isolated areas 110 there is no copper or other conductive substrate, nor paths or components. These isolated areas 110 ensure the safety and security of a shielding arrangement. Further the isolation 110 between a shielding can frame and an electrical area, supports the idea of small loops and makes the shielding of the electrical area more effective against outside interferences. No exterior connection line or signal line can pass through the isolated area. So this isolated area 110 also prevents the exterior signals from intruding into the shielded electrical area.

According to an advantageous embodiment all components inside the shielded area are grounded to common grounds. In this exemplary embodiment the common grounds are formed by layers 104 and 106. Typically it is essential to have at least two common grounds. With the aid of the common grounds the loops can be kept small. It is important to keep the loops of filtering circuits as small as possible to minimize and control the uncertainties and instabilities of the operation.

According to an advantageous embodiment all signals needed to be shielded are arranged to go through a shielded signal layer, layer 105 in FIG. 1. The most essential signals to be shielded are the signals of sensitive electrical components and the signals of radiation sources. The selection of the most essential signals to be shielded is an important part of the design and implementation process. The selection of the shielded signals thus depends on the type and occurrence of sensitive or radiating components in a certain arrangement, and their relations and associations to the arrangement as a whole. When an internal interference occurs, there exists an emitting source of radiation, a respective victim component, which suffers from the interference, and a coupling path between those two.

According to an advantageous embodiment, paths of the signals to be shielded are placed in so called coaxial tunnel formed between the ground lines, formed by ground potential layers 104 and 106 in this exemplary embodiment. FIG. 1 shows signal "vias" 20 to the components 109*f*, 109*b* and 109*e* and coaxial ground "vias" 10 perpendicular to the layers 101–108. The coaxial structure of a shielding path is advantageously maintained from an emitting source component to a respective component, all the way through the coupling path. Typically the structure is tubular. It is important that the signal propagates through the tubular, coaxial, shielded signal tunnel to the signal layer and heads back to the tunnel so, that the signal is in a shielded space all the way. Preferably there are only shielded, coaxial paths and ways for exterior signals to propagate to the shielded electric area within the coverage of the shielding can.

In signal layers 107 and 108 there should be only needed elements, nothing extra. Generally it is advantageous to keep the signals and signal layers nearby the components to prevent long paths and loops. Regarding this the arrangement presented in FIG. 1 is to be understood as an example only. Any larger through holes for input and/or output are advantageously implemented in middle layers, e.g. layers 102–107 in FIG. 1. In common the middle layers are safer to use as input and output layers than the outer, boundary layers.

For implementation of the present invention there is typically used a printed circuit board having 8 layers. This is however only one common solution and any multilayered printed circuit board may be used as well to implement a shielding arrangement according to the invention. There are no limits for the number of layers. The ground potential layers 104 and 106 in FIG. 1 are only one example for implementing an advantageous embodiment of the invention. The invention is not bound to any material of a substrate of a printed circuit board. Typically it is assumed that a printed circuit board includes different type of "via" structures, for example microvias. The shielding can according to an advantageous embodiment of the present invention can be implemented without restrictions in all radio frequency (RF) and base band (BB) areas as well as with voltage-controlled oscillators (VCO). The illustrated arrangement built-up on a printed circuit board prevents uncertain return current paths to any high or low frequency signals. The more effective RF-sources are, the better shielding those require for both input and output signals.

Figure 2:
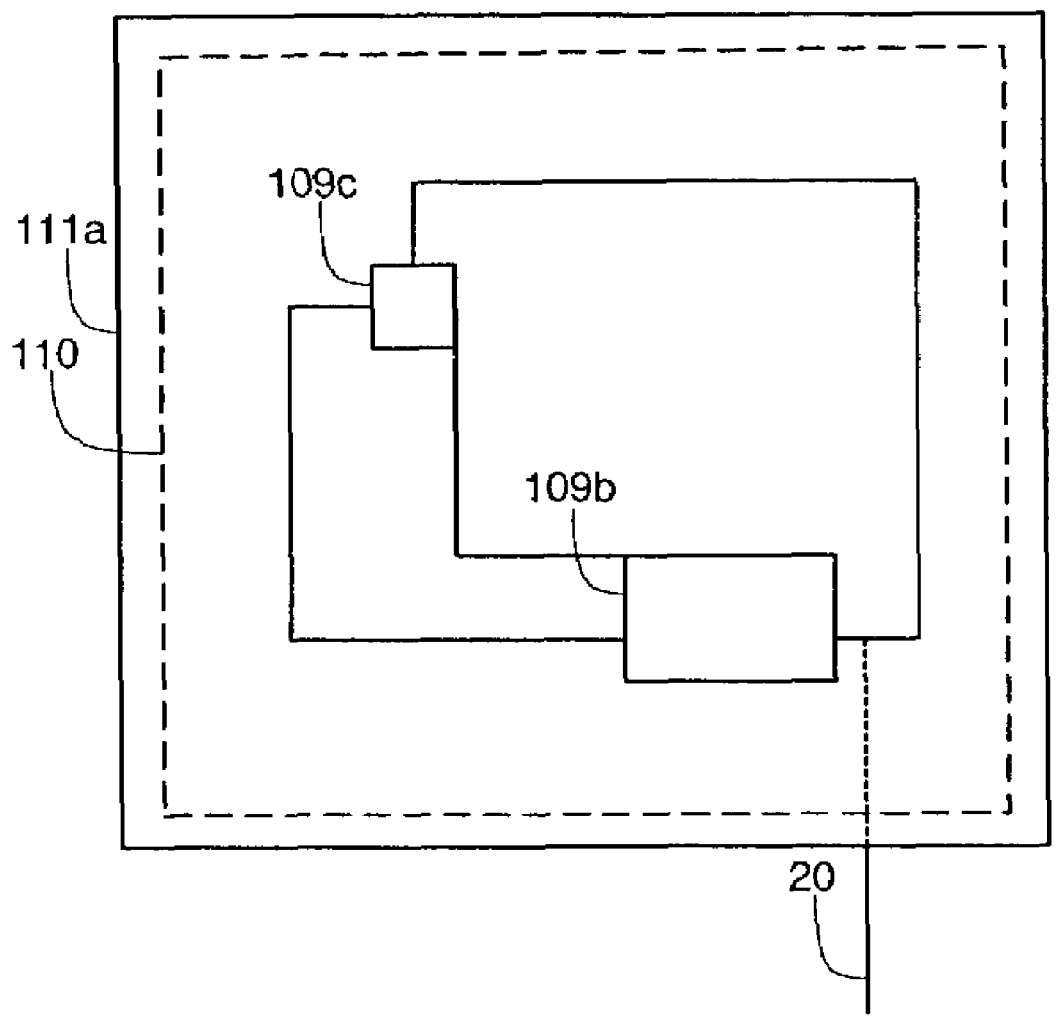
FIG. 2 illustrates a top view of an advantageous embodiment of the present invention.

FIG. 2 illustrates a top view of a shielding arrangement according to an advantageous embodiment. There are illustrated a top view of a printed circuit board having a shielding can frame 11a and two components 109b and 109c. There is illustrated some connections between the components 109b and 109c. Also the isolated area 110 corresponding to FIG. 1 is illustrated in FIG. 2 by a dashed line encircling between the edges of a shielding frame and component area to be shielded.

Further the FIG. 2 illustrates a signal 20 heading to the shielded area. Preferably any signals inputted to or outputted from the shielded area propagate through a shielded coaxial tunnel formed between ground potential layers. No exterior signals can propagate to the uppermost signal layer straightforward along the uppermost signal layer. In FIG. 2 a dashed line illustrates signal line 20 situated between ground potential layers inside the area within the coverage of the shielding can. According to an advantageous embodiment there is only a certain layer or layers through which exterior signals can emerge to the coverage area of the shielding. Then layers are passed by signals straight upwards to the uppermost signal layer along a via.

The illustrated embodiments are to be interpreted as examples describing the basic idea of the invention. The invention can be implemented in many forms and modifications without departing the scope of the invention.

What is claimed is:

1. A shielding arrangement comprising:
   a layered printed circuit board having at least one electrical component mounted on a first outer surface of the layered printed circuit board,
   a shielding can mounted on the first outer surface of the layered printed circuit board, the shielding can covering said at least one electrical component,
   a first ground potential layer being either inside the layered printed circuit board or on the first outer surface of the layered printed circuit board,
   a second ground potential layer being either inside the layered printed circuit board or on a second outer surface of the layered printed circuit board and being farther from the first outer surface of the layered printed circuit board than the first ground potential layer,
   at least one grounding connection between the edges of the shielding can and the first ground potential layer,
   at least one grounding connection from the first ground potential layer or the shielding can to the second ground potential layer, the shielding can, the first ground potential layer, the second ground potential layer, and the grounding connection thus forming a Faraday cage,
   a third ground potential layer being inside the layered printed circuit board between the first ground potential layer and the second ground potential layer, and
   at least one grounding connection between the electrical components inside the shielding can and the third ground potential layer.

2. A shielding arrangement according to claim 1, wherein the grounding connections of the shielding can and the grounding connections of the components inside the shielding can are isolated in uppermost signal layers of the multilayered printed circuit board.

3. A shielding arrangement according to claim 1, comprising a coaxial shielding paths between ground potential layers for signals emerging inside the shielding can.

4. A shielding arrangement according to claim 1, wherein signals emerge from between the ground potential layers to said electrical component only within coverage of the shielding can.

5. A shielding arrangement according to claim 1, comprising a coaxial shielding paths between ground potential layers of the printed circuit board for a whole coupling path from a source emitting signals to a receptive component.

6. A shielding arrangement according to claim 1, wherein the shielding arrangement comprises at least one signal layer being inside the layered circuit board between the third ground potential layer and the first ground potential layer.

* * * * *